United States Patent [19]
Guimier et al.

[11] 3,988,575
[45] Oct. 26, 1976

[54] MAGNETIC-DOUGHNUT MEMORIZING DEVICE FOR COUNTING SYSTEM

[75] Inventors: Jacques A. Guimier, Courtry; Pierre F. Coutin, Paris, both of France

[73] Assignee: R. Alkan & Cie, Valenton, France

[22] Filed: Dec. 5, 1974

[21] Appl. No.: 530,033

[30] Foreign Application Priority Data
Dec. 13, 1974 France .................. 74.44778

[52] U.S. Cl. .................. 235/92 FP; 235/92 MC; 235/92 R; 307/238
[51] Int. Cl.[2] .................. G06M 3/12; H03K 21/34
[58] Field of Search .......... 235/92 B, 92 CC, 92 FP, 235/92 MC; 328/50, 37; 307/238

[56] References Cited
UNITED STATES PATENTS

| | | | |
|---|---|---|---|
| 2,772,370 | 11/1956 | Bruce et al. | 235/92 MC |
| 2,982,870 | 5/1961 | Hilbiber | 307/238 |
| 3,350,652 | 10/1967 | Cottrez | 307/238 X |
| 3,418,646 | 12/1968 | Marcus | 307/238 X |
| 3,597,629 | 8/1971 | Bartlett | 307/238 |

*Primary Examiner*—Joseph M. Thesz
*Attorney, Agent, or Firm*—Ulle C. Linton

[57] ABSTRACT

Device for memorizing the position of a counting system in case of failure or cut-off in the supply current characterized by the combination of a magnetic doughnut with each output of said counter, said doughnut being adapted to be energized by a pair of windings supplied with current under the control of the associated counter output so as to assume one or the other of two states according to the momentary state of the associated counter output, said doughnut further comprising a third winding delivering or not, when the supply current is restored, a pulse utilized for restoring the counter to the state it had when the cut-off took place.

1 Claim, 29 Drawing Figures

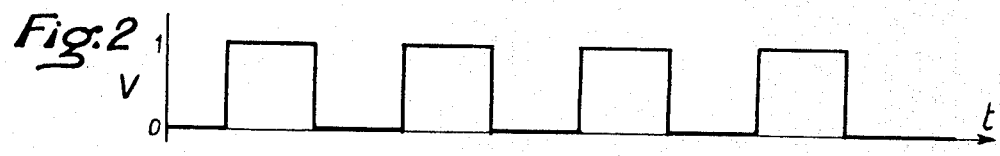
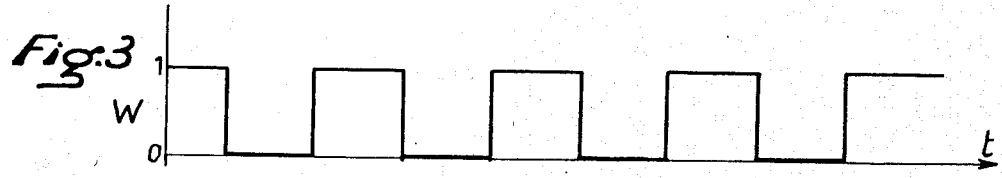
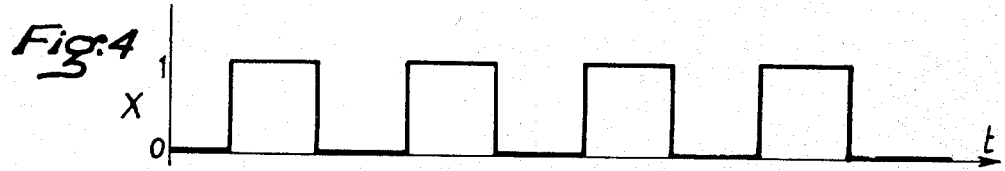
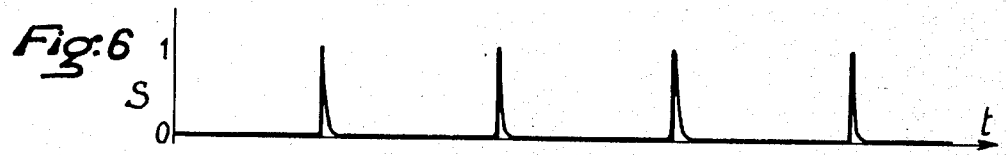
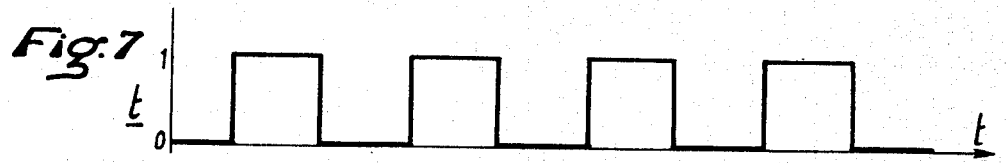

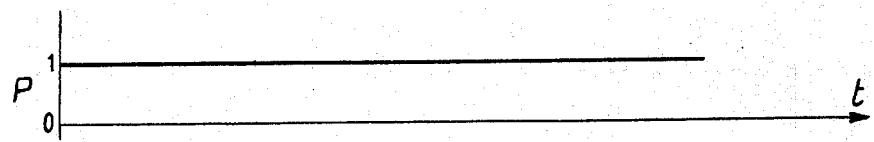
Fig.8 P
Fig.9 Q
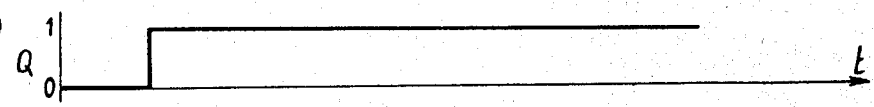
Fig.10 R
Fig.11 S
Fig.12 T
Fig.13 U
Fig.14 V
Fig.15 W
Fig.16 X
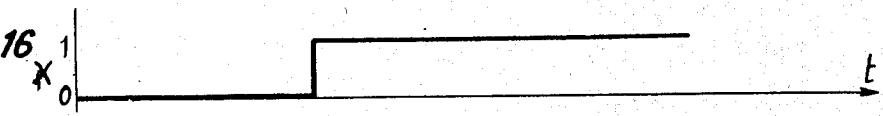
Fig.17 Y
Fig.18 Z
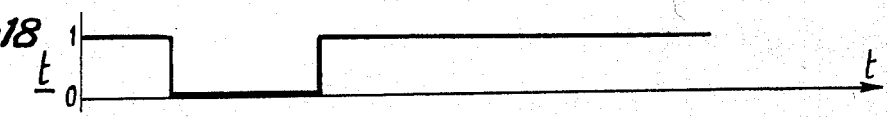

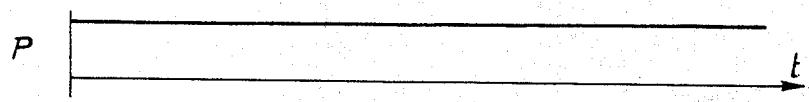
Fig. 19  P
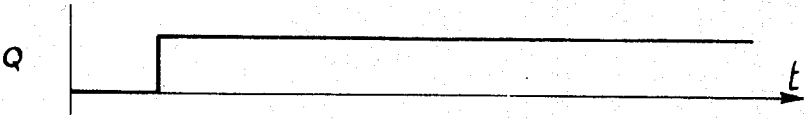
Fig. 20  Q
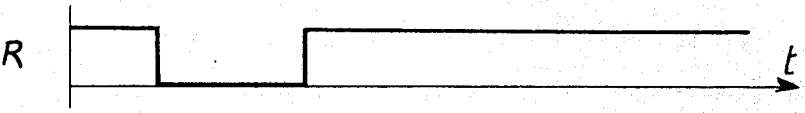
Fig. 21  R
Fig. 22  S
Fig. 23  T
Fig. 24  U
Fig. 25  V
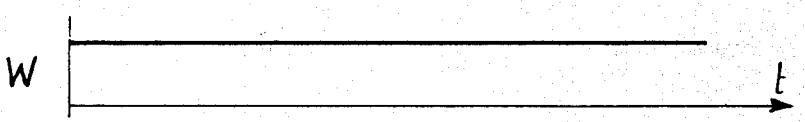
Fig. 26  W
Fig. 27  X
Fig. 28  Y
Fig. 29  $\underline{t}$

MAGNETIC-DOUGHNUT MEMORIZING DEVICE FOR COUNTING SYSTEM

BACKGROUND OF THE INVENTION

The present invention relates in general to memorizing devices and has specific reference to devices of the magnetic-doughnut type designed more particularly for counting systems.

It is known that the over-all dimensions of a counting device are not of primary importance in a project whereas on the other hand the memorizing rapidity is an essential requirement, a memorizing device of the magnetic tore or doughnut can be used, with the additional advantage that this device is completely static.

These magnetic doughnuts or tores are known components used as a rule as independent memory units for example in computers where they can be utilized at any time during the operation of the apparatus.

The present invention consists essentially in utilizing such magnetic doughnuts or tores in devices comprising integrated counting decades with which they are associated. Under normal operating conditions, they have no active function, but in case of failure in the power supply, followed by a re-energization of the system they restore or resume automatically the position in which the counter was left when the current failure or cut-off occurred. This invention is applicable more particularly to devices installed on military aircrafts.

In the system incorporating bistable relays with magnetic locking action, for example as disclosed in the U.S. Pat. No. 3,879,642 of Apr. 22, 1975 in the name of the same applicants the counter position is memorized after a certain lag following the end of a counting sequence. The use of magnetic doughnuts according to this invention provides an immediate memorization so that a cut-off can take place at any time during the counting operation.

A device of this character is described hereinafter with reference to the accompanying drawings, in which:

BRIEF DESCRIPTION OF THE DRAWINGS

FIGS. 2 to 7 inclusive illustrate the signal waveform at different points of the circuit of FIG. 1, in case of permanent operation of the counter;

FIGS. 8 to 18 inclusive illustrate the signal waveform at the same points when the energizing voltage is restored, in case the counter output A was in state or condition 1 when the current failure took place, and FIGS. 19 to 29 inclusive illustrate the signal waveform when the energizing voltage is restored, in case the counter A was in condition "O" when the current failure took place.

DESCRIPTION OF THE PREFERRED EMBODIMENT

Figure 1:
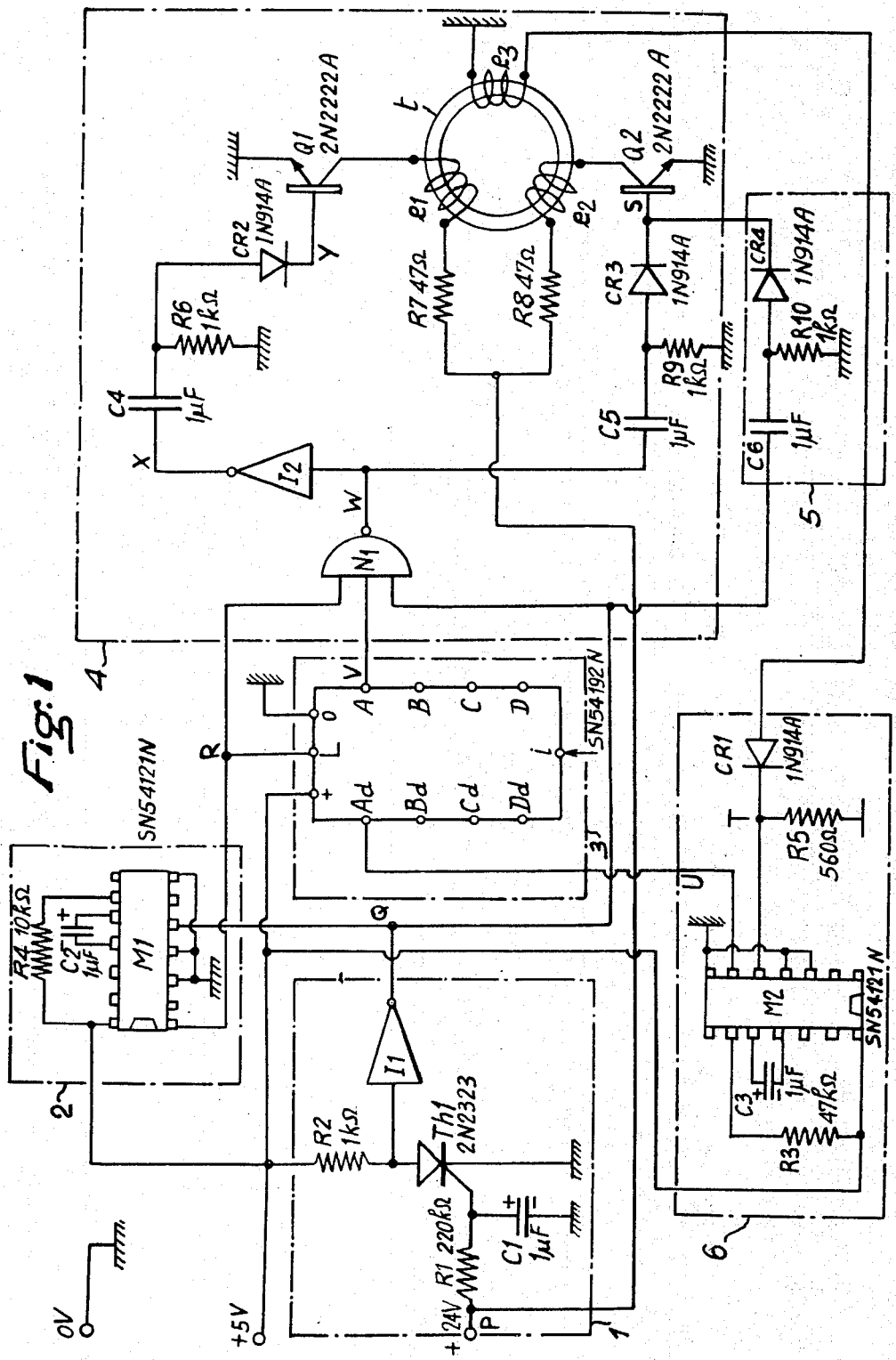
FIG. 1 is a wiring diagram of the device of this invention.

The circuits illustrated in FIG. 1 comprise different units designated by the reference numerals 1 to 6, which consist respectively:
 of a delay-action device 1;
 of a monostable flip-flop or univibrator 2 delivering, each time the unit is energized, a pulse of given duration;
 a counter 3;
 a device 4 for recording in a magnetic doughnut or tore t the state 0 or 1 of the counter output A;
 a device 5 for reading the doughnut condition, and
 a device 6 including a monostable flip-flop M2 delivering a pulse of predetermined duration each time the tore or doughnut t changes from state 1 to state 0.

During the counting sequence the coded output A of counter 3 assumes at point V the states 0 and 1, in succession. (FIG. 2). The same states are also found at X (FIG. 4) after two reversals at N1 and I2, the complementary states being at W (FIG. 3).

The signals from X and W are differentiated by the capacitor resistor assembly C4 and R6 on the one hand and by the assembly C5 and R9 on the other hand; the negative pulses resulting therefrom are blocked by diodes CR2 and CR3 whereas the positive pulses fed to points Y and S (FIGS. 5 and 6) are used for making the transistors Q1 and Q2 conducting and thus energize the windings e1 and e2 of doughnut t.

It will be assumed that when e1 is energized the doughnut t is magnetized to state 1, and when e2 is energized, it assumes a magnetized state 0 (FIG. 7). This is tantamount to saying that said doughnut t records at any time the state of the counter output A and will preserve this state in its "memory" in case the current supply were discontinued for any reason.

When restoring the voltage, the d.c. +5 V and +24 V lines are energized simultaneously; d.c. +24 V line (points P, FIGS. 8 and 19) supplies current on the one hand to the windings e1 and e2 through resistors R7 and R8, and on the other hand to the delay-action device 1 consisting of a thyristor Th 1 having its trigger responsive to a circuit R1, C1 of a charging resistor R3 and of a reversing circuit I1. With this device, any erratic operations are positively precluded during the transient time period following the switching-on, during which period the states of the circuit concerned are indeterminate.

The delayed signal obtained at Q (FIG. 9) controls simultaneously:
 the monostable flip-flop M1 so that the latter will deliver at R a pulse the duration of which is determined by R4 and C2, this pulse being utilized at L for charging of the counter;
 one of the three inputs of the AND-NO gate circuit N1, the other inputs being controlled by signals delivered by A and R, thus preventing the output W from changing its state until the charging signal has disappeared;
 a device 5 for reading the momentary condition or state of doughnut t, which consists of a differentiating circuit C6–R10 and of a diode CR4 through which only the positive pulse can flow, this pulse being fed to point S (FIG. 11) and corresponding to the ascending wavefront of the signal obtained at Q, and causing the transistor Q2 to be conducting and the energization of winding e2.

Under these conditions, two cases may be contemplated, as follows:

First case

The tore or doughnut t is in state 1 corresponding to a state 1 of the counter output A when the current supply was cut off.

Under these conditions, the energizaton of e 2 is attended by the change of state of said doughnut which changes from 1 to 0. The flux variation resulting therefrom produces a voltage pulse in winding e3 of said doughnut t. This pulse is collected at T (FIG. 12) across the terminals of the charging resistor R5 and transmitted to the monostable flip-flop M2 whereby the latter delivers at point U a positive pulse (FIG. 13) of which the duration is determined by R3 and C3, the product R3, C3 being greater than R4, C2. This last-mentioned pulse is transmitted to the input Ad of counter 3, and thus the counter output A will assume the state 1 (point V, FIG. 14).

At the end of the charging pulse, the output of N1 (point W, FIG. 15) which was kept in state 1 by the signals issuing from Q and R, will change its state, thus causing, according to the sequence explained hereinabove, the energization of winding e1 and the doughnut to change from state 0 to state 1 (FIG. 19).

The counter and doughnut assembly will thus resume the state 1 which it had before the current supply was cut off.

Second case

The tore or doughnut t is in state 0 corresponding to a 0 state of the counter output A when the current supply was cut off.

When winding e2 is energized, the doughnut t remains in its state, so that no pulse is produced in winding e3; the monostable flip-flop M2 remains in state 0, the same applying to the counter output A. The output W of the AND-NO gate circuit remains in state 1 at the end of the charging pulse and the tore remains in state 0. The counter and doughnut assembly will thus resume the states 0 which they had before the current supply was cut off.

The same reasoning would of course apply to the other outputs B, C and D of counter 3.

All the component elements of the device are of static nature and afford not only a high rate of operation but also the possibility or preserving the memory even in case of failures or cut-offs in the supply current during the counting operation.

Of course, various modifications and changes may be brought to the embodiment of the invention described by way of example, without departing however from the basic principles of the invention as set forth in the appended claim.

What we claim is:

1. Device for memorizing the position of a counting system in case of failure or cut-off in the supply current, comprising a counter consisting of counting decades constituted by intergrated circuits, magnetic doughnuts each associated with an output of said counter, a pair of windings associated with each magnetic doughnut, a source of current, said pair of windings being supplied with current from said source under the control of the associated counter output so as to assume one or the other of two states according to the momentary state of the associated counter output, a monostable flip-flop, each magnetic doughnut further comprising a third winding delivering or not to said counter through said monostable flip-flop, when the supply current is restored, a pulse utilized for restoring said counter to the state it had when the cut-off took place.

* * * * *